United States Patent
Liao et al.

(10) Patent No.: US 9,087,793 B2
(45) Date of Patent: Jul. 21, 2015

(54) METHOD FOR ETCHING TARGET LAYER OF SEMICONDUCTOR DEVICE IN ETCHING APPARATUS

(71) Applicant: TAIWAN SEMICONDUCTOR MANUFACTURING CO., LTD., Hsinchu (TW)

(72) Inventors: Han-Wen Liao, Taichung (TW); Wei-Tai Lin, Taichung (TW); Wen-Sheng Wang, Taichung (TW); Chih-Yu Lin, Tainan (TW); Cherng-Chang Tsuei, Hsin-Chu (TW); Chen-Hsiang Lu, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 76 days.

(21) Appl. No.: 14/103,681

(22) Filed: Dec. 11, 2013

(65) Prior Publication Data

US 2015/0162206 A1    Jun. 11, 2015

(51) Int. Cl.
*H01L 21/308* (2006.01)

(52) U.S. Cl.
CPC ........ *H01L 21/3088* (2013.01); *H01L 21/3086* (2013.01)

(58) Field of Classification Search
CPC .............. H01J 37/32724; H01J 37/32926; H01L 21/67069; H01L 21/67248; H01L 22/12; H01L 22/20; H01L 22/26; H01L 2924/0002; H01L 21/31116; H01L 21/31144; H01L 21/32137; H01L 21/31138
USPC .......................................... 438/5, 17
See application file for complete search history.

(56) References Cited

U.S. PATENT DOCUMENTS

2005/0167397 A1*  8/2005  Chen et al. ............. 216/59

* cited by examiner

*Primary Examiner* — Selim Ahmed
*Assistant Examiner* — Changhyun Yi
(74) *Attorney, Agent, or Firm* — McDermott Will & Emery LLP

(57) ABSTRACT

A method for etching a target layer of a semiconductor device in an etching apparatus is provided. To form an element, the method includes forming a photoresist pattern on the target layer of the semiconductor device, in which the photoresist pattern has an after-develop-inspection critical dimension (ADI CD). A target after-etch-inspection critical dimension (AEI CD) of the element is provided, as well as a trim time of the target layer. The etching apparatus is provided and a formation time of a protective layer on an inner wall of the etching apparatus is determined based on the ADI CD, the target AEI CD and the trim time. The protective layer for the predetermined formation time is formed to perform a trimming process on the target layer for the trim time by using the photoresist pattern as a mask, so as to form the element.

20 Claims, 6 Drawing Sheets

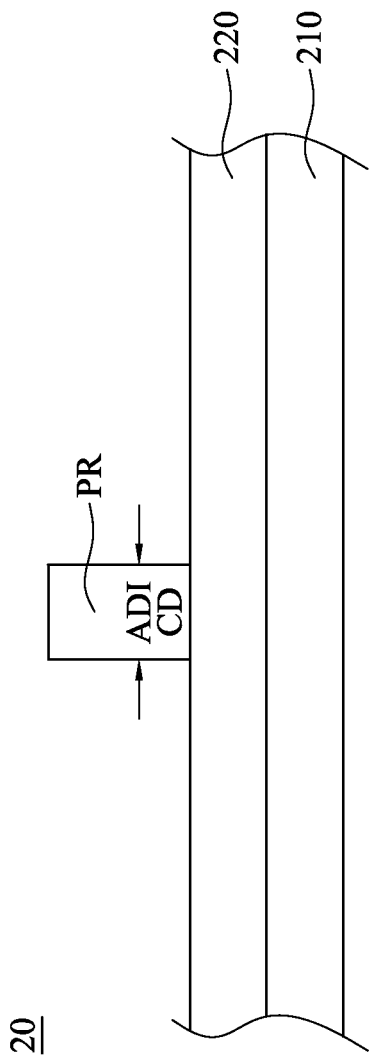
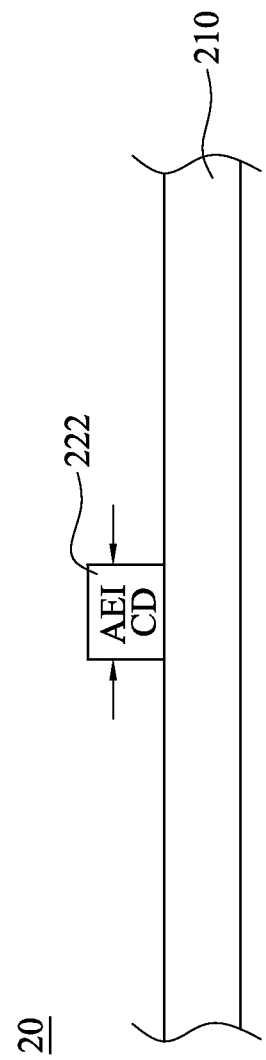

METHOD FOR ETCHING TARGET LAYER OF SEMICONDUCTOR DEVICE IN ETCHING APPARATUS

BACKGROUND

Modern integrated circuits contain millions of individual elements that are formed by patterning the materials, such as silicon, metal and/or dielectric layers. A set of processing steps is performed on a lot of semiconductor wafers to from the elements. For example, in lithography process, a process layer is formed on a semiconductor wafer, and a photoresist pattern then formed on the process layer by performing known photolithography techniques. Next, a trimming process is performed on the process layer by the photoresist pattern as a mask. As such, an element like a gate electrode of a transistor is obtained.

Critical dimensions (CDs), in either geometry or spacing, are used to monitor the pattern, and to ensure those to meet designed values of a customer specification. CD bias refers to an extent that the designed values mismatch actual values. Ideally, CD bias approaches zero, but in actuality, CD bias exist and affect performance and operation of a resulted semiconductor device, so as the wafer yield. Therefore, controlling of CD bias is needed.

BRIEF DESCRIPTION OF THE DRAWINGS

The invention can be more fully understood by reading the following detailed description of the embodiment, with reference made to the accompanying drawings as follows:

FIGS. 2A-2B are cross-sectional views of a target layer of a semiconductor device before and after performing a trimming process according to various embodiments of the present disclosure.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, an element includes embodiments having two or more such elements, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
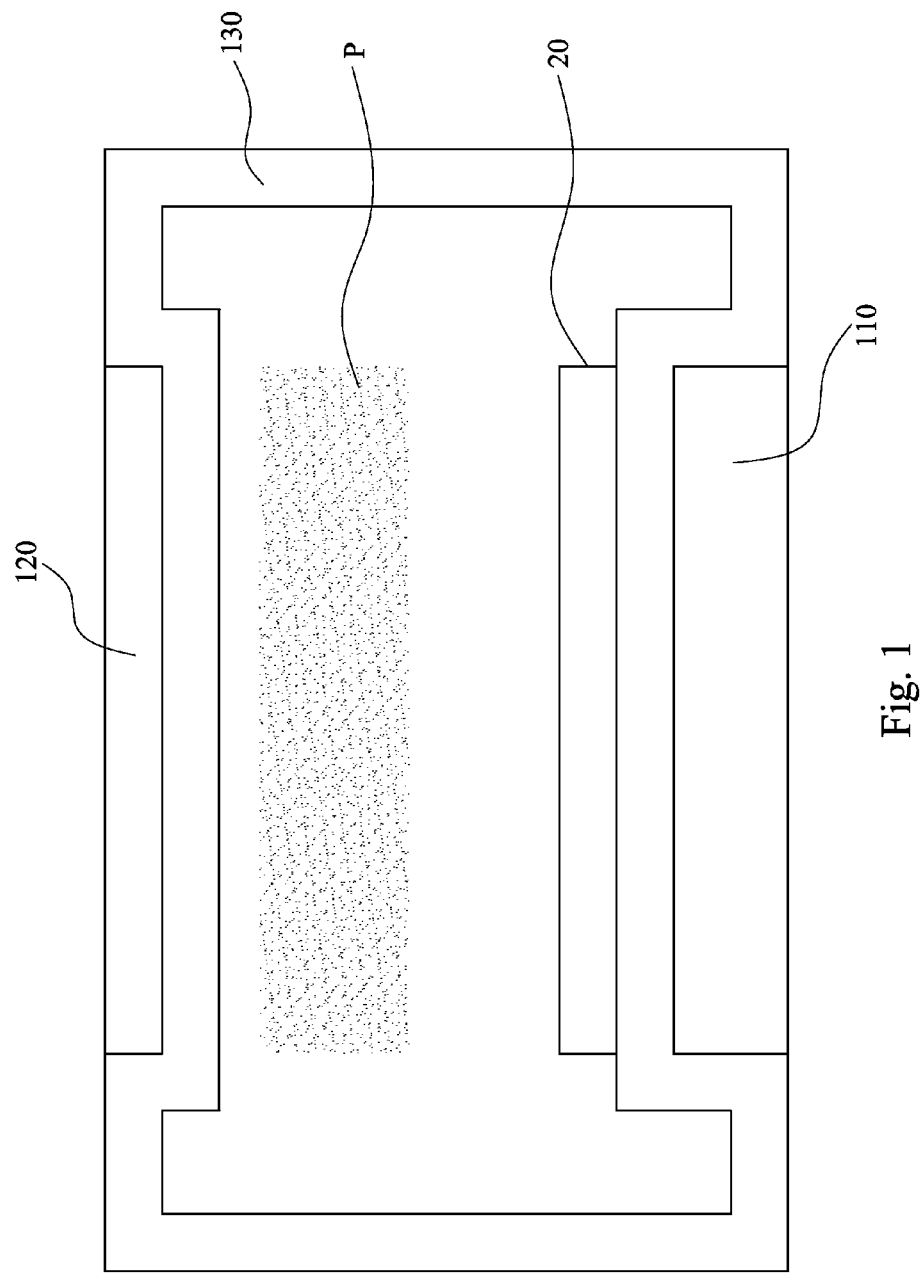
FIG. 1 is a schematic diagram of an etching apparatus according to various embodiments of the present disclosure.

FIG. 1 is a schematic diagram of an etching apparatus 10 according to various embodiments of the present disclosure. The etching apparatus 10 includes a first electrode 110 and a second electrode 120 opposite to each other. Plasma P is input by a gas inlet pipe (not shown). However, the plasma P may damage an inner wall of the etching apparatus 10, such that there is a need for a protective layer 130 covering the inner wall to protect it from damage during trimming processes.

As shown in FIG. 1, a semiconductor device 20 is delivered into the etching apparatus 10 and then disposed on the first electrode 110, which may include one or more target layers (not shown) for etching. FIG. 2A is a cross-sectional view of a semiconductor device 20 before performing a trimming process according to various embodiments of the present disclosure. The semiconductor device 20 includes a substrate 210, a target layer 220 and a photoresist pattern PR covering a portion of the target layer 220. At this time, an after-develop-inspection critical dimension (ADI CD) of the photoresist pattern PR is measured.

FIG. 2B is a cross-sectional view of the semiconductor device 20 after performing the trimming process according to various embodiments of the present disclosure. As shown in FIGS. 2A-2B, exposed portions of the target layer 220 of FIG. 2A are removed by the plasma P of FIG. 1 during the trimming process to form an element 222, and the photoresist pattern PR is then stripped. The element 222 has an after-etch-inspection critical dimension (AEI CD). In order to control CD bias (i.e., the AEI CD–the ADI CD), a process control method should be provided before the trimming process. For example, a target AEI CD of the element 222 is provided before performing the trimming process. The ADI CD, the target AEI CD and a trim rate may determine a trim time of the trimming process. Specifically, the trim time may be obtained by calculating a model: (the target AEI CD)–(the ADI CD)=CD bias=(the trim rate)×(the trim time)+b, and "b" is derived from a feedback function. If the ADI CD is less than the target AEI CD, the trim time is decreased. Conversely, if the ADI CD is greater than the target AEI CD, the trim time is increased. However, if a longer trim time is needed, process throughput will be impacted. Therefore, novel process control methods for controlling CD bias in the trimming process continue to be sought.

In the trimming process, the increase in the trim rate results in the decrease in the trim time. According to embodiments of the present disclosure, it is found that the trim rate depends on a thickness of the protective layer 130 of FIG. 1. The trim rate increases with the decreasing of the thickness of the protective layer 130. Regarding the dependence, the thinner the thickness of the protective layer 130, the greater the delta voltage to the semiconductor device 20; the greater the delta voltage to the semiconductor device 20, the greater the plasma ion energy. Accordingly, the increase of the plasma ion energy, the trim rate of the trimming process is increased. Accordingly, the thickness of the protective layer 130 plays an important role in the trimming process. The thickness of the protective layer 130 is controlled by a formation rate and a formation time, and thus the formation time can be acted as a novel control parameter in the process control method for the trimming process. Therefore, in various embodiments of the present disclosure, novel methods for etching the target layer 220 controlled by the formation time of the protective layer 130 and both the formation time of the protective layer 130 and the trim time of target layer 220 are provided.

Figure 3:
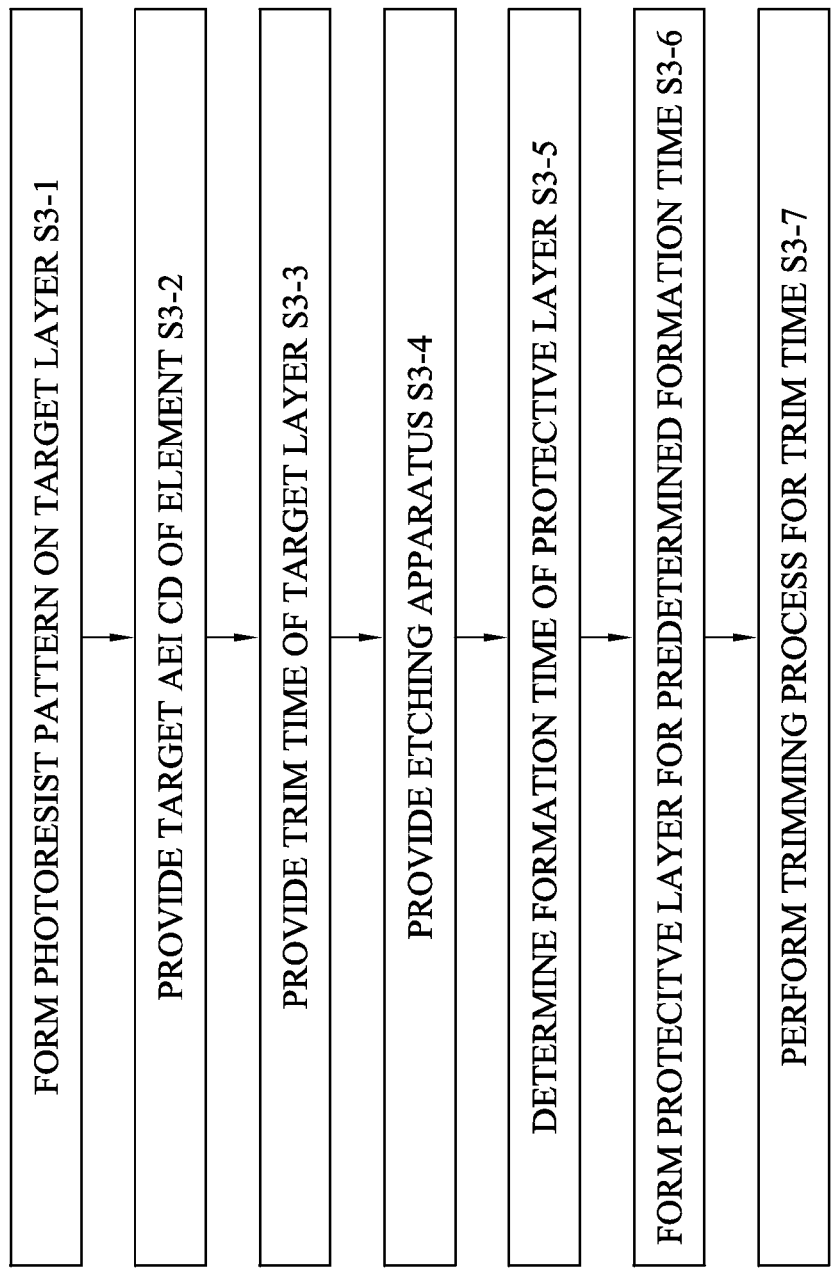
FIG. 3 is a flow chart illustrating a method for etching a target layer of a semiconductor device in an etching apparatus to form an element according to various embodiments of the present disclosure.

FIG. 3 is a flow chart illustrating a process control method for etching a target layer of a semiconductor device in an etching apparatus to form an element according to various embodiments of the present disclosure. The method of FIG. 3 is controlled by the formation time of the protective layer 130 of FIG. 1.

In operation S3-1, the photoresist pattern PR is formed on the target layer 220 of the semiconductor device 20, as shown in FIG. 2A. For instance, a photoresist layer (not shown) is blanket formed on the target layer 220, and then patterned to form the photoresist pattern PR by performing exposure and development processes. The photoresist pattern PR has the ADI CD. The target layer 220 may be made of any material, such as metals, alloys, inorganic insulating materials and other suitable materials. The target layer 220 may be formed by any suitable process, such as chemical vapor deposition (CVD), physical vapor deposition (PVD), sputtering, plating and spin-on coating.

In operation S3-2, a target AEI CD of the element 222 is provided. In operation S3-3, a trim time of the target layer 220 is provided so as not to affect the process throughput. In other words, the target layers 220 of a plurality of the semiconductor devices 20 may be processed for the same trim time to maintain the process throughput.

In operation S3-4, the etching apparatus 10 is provided. The specific features of the etching apparatus 10 may be referred to those exemplified for the etching apparatus 10 of FIG. 1, and thus omitted herein. In operation S3-5, the formation time of the protective layer 130 on the inner wall of the etching apparatus 10 is determined based on the ADI CD, the target AEI CD and the trim time, which are known values. It is noteworthy that determining the formation time of the protective layer 130 (i.e., operation S3-4) can determine the trim rate of the trimming process. In various embodiments, it assumes that the relationship between the trim time of the target layer 220 and the formation time of the protective layer 130 is a linear relationship, and determining the formation time of the protective layer 130 on the inner wall of the etching apparatus 10 can be conducted by calculating a model (1): (the target AEI CD)−(the ADI CD)=a(the trim time+c× the formation time)+b, in which a is a function of the formation time, and b is a control offset value derived from a feedback function, and c is a function of the formation time and the trim time. In other words, "a" is the trim rate of the trimming process. However, the relationship between the trim time of the target layer 220 and the formation time of the protective layer 130 may be a non-linear relationship, and thus applicable models may be different from the model (1). Therefore, in practical applications, models for determining the formation time of the protective layer 130 may be altered to fit various relationships between parameters.

In various embodiments, in order to obtain a relationship between the formation time and the trim time to determine "c" of the model (1), the method further includes: developing a first correlation between formation time and AEI CD under a condition of a constant trim time; developing a second correlation between trim time and AEI CD under a condition of a constant formation time; and determining c based on the first correlation and the second correlation before determining the formation time of the protective layer 130 on the inner wall of the etching apparatus 10. A specific embodiment for determining c of the model (1) by the first and second correlations will be described in detail below.

Figure 4:
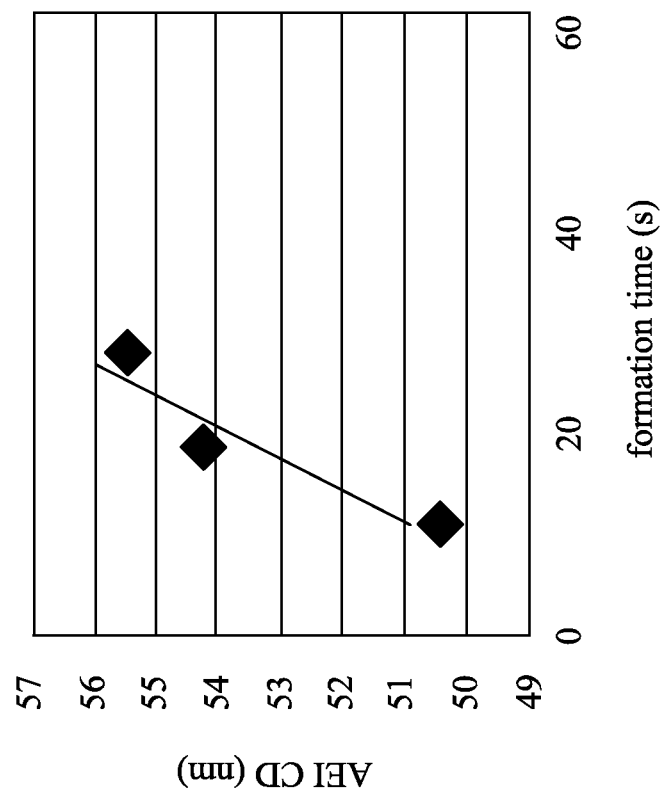
FIG. 4 is a relationship diagram between AEI CD and formation time according to various embodiments of the present disclosure.

FIG. 4 is a relationship diagram between the AEI CD and the formation time according to various embodiments of the present disclosure. The correlation shown in FIG. 4 may be acted as the first correlation mentioned above, which is obtained by processing three semiconductor devices 20 of FIG. 2A with various formation times, which respectively are 11, 19 and 27 seconds, under a condition of a constant trim time (95 seconds). A linear regression line of the first correlation is developed, which has a function of y=0.3125x+47.462. It means that the AEI CD increases by 0.3125 nm with the increase of one second of the formation time.

Figure 5:
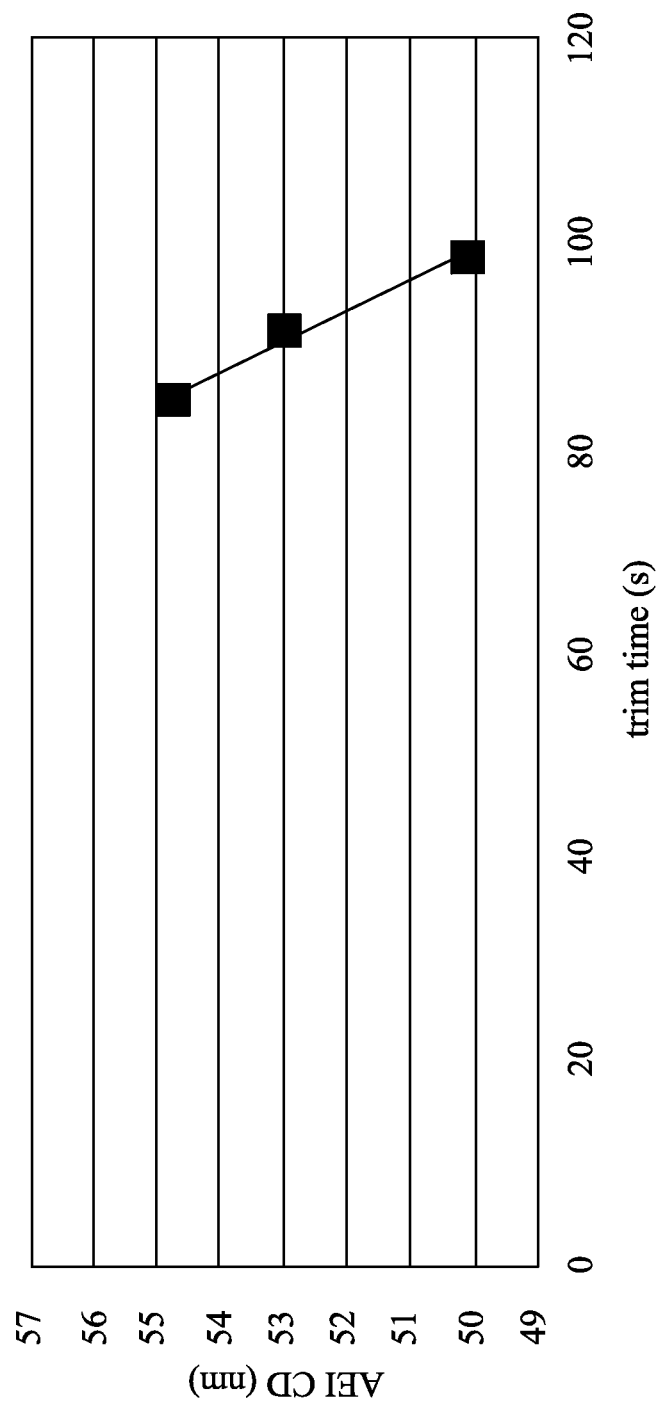
FIG. 5 is a relationship diagram between AEI CD and trim time according to various embodiments of the present disclosure.

FIG. 5 is a relationship diagram between the AEI CD and the trim time according to various embodiments of the present disclosure. The correlation shown in FIG. 5 may be acted as the second correlation mentioned above, which is obtained by processing three semiconductor devices 20 of FIG. 2A with various trim times, which respectively are 88, 95 and 102 seconds, under a condition of a constant formation time (19 seconds). A linear regression line of the second correlation is developed, which has a function of y=−0.3379x+83.653. The AEI CD decreases by 0.3379 nm with the increase of one second of the trim time.

In view of the above, to let the CD bias (i.e., the target AEI CD−the ADI CD) approach zero, the trim time should increase by 0.925 second (0.925=0.3125/0.3379) with the increase of one second of the formation time so as to remove excess CD, according to various embodiments of the present disclosure. Therefore, "c" of the model (1) can be set as −0.925. In other words, determining c based on the first correlation and the second correlation can be conducted by calculating a ratio of the slope of the linear regression line of the first correlation to the slope of the linear regression line of the second correlation. "c" is a negative value since the slope of the linear regression line of the first correlation is a positive value and the slope of the linear regression line of the second correlation is a negative value.

In operation S3-6, the protective layer 130 is formed for the predetermined formation time so as to determine the trim rate of the trimming process. In various embodiments, forming the protective layer 130 on the inner wall of the etching apparatus 10 is conducted by a chemical vapor deposition method. The chemical vapor deposition method is conducted by providing silicon gas and oxygen into the etching apparatus 10. Therefore, the protective layer 130 composed of silicon oxide is formed on the inner wall of the etching apparatus 10 to protect it from damage during a subsequent trimming process. In various embodiments, the silicon gas is selected from the group consisting of $SiH_2Cl_2$, $SiHCl_3$, $SiCl_4$, $SiF_4$ and a combination thereof, but not limited thereto.

In operation S3-7, the trimming process is performed on the target layer 220 for the trim time by using the photoresist pattern PR as a mask to form the element 222. As shown in FIGS. 2A-2B, exposed portions of the target layer 220 of FIG. 2A are removed by the plasma P of FIG. 1 during the trimming process to form the element 222, and the photoresist pattern PR is then stripped. An actual AEI CD of the element 222 may be measured and then fed back to the step of determining the formation time of the protective layer 130 (i.e., operation S3-5) to determine b.

Figure 6:
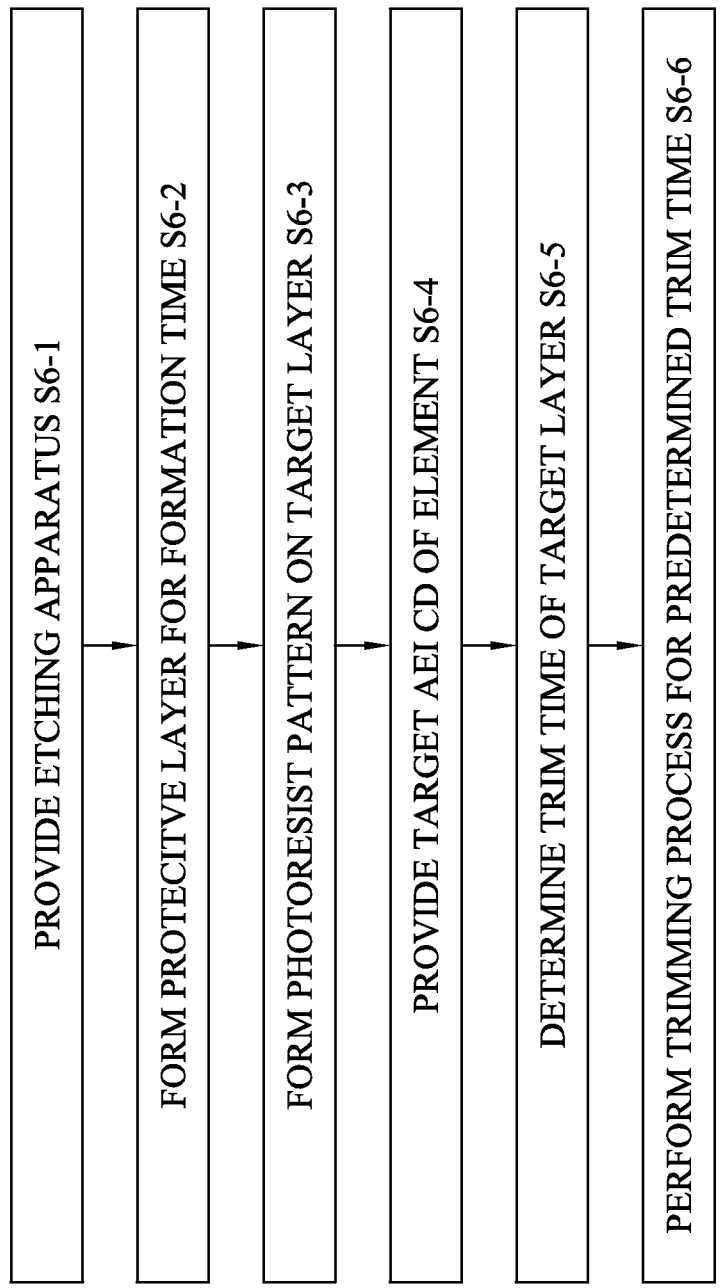
FIG. 6 is a flow chart illustrating a method for etching a target layer of a semiconductor device in an etching apparatus to form an element according to various embodiments of the present disclosure.

FIG. 6 is a flow chart illustrating a process control method for etching a target layer of a semiconductor device in an etching apparatus to form an element according to various embodiments of the present disclosure. The method of FIG. 6 is controlled by both the formation time of the protective layer 130 of FIG. 1 and the trim time of the target layer 220 of FIG. 2A.

In operation S6-1, the etching apparatus 10 of FIG. 1 is provided, which may be referred to those exemplified for operation S3-4. In operation S6-2, the protective layer 130 is formed on the inner wall of the etching apparatus 10 for a formation time, which can determine a trim rate of a subsequent trimming process. The formation time may be adjusted to obtain an adequate trim rate of the trimming process.

In operation S6-3, a photoresist pattern PR is formed on the target layer 220, in which the photoresist pattern PR has the ADI CD, as shown in FIG. 2A. The specific features of operation S6-3 may be referred to those exemplified for operation S3-1, and thus omitted herein. In operation S6-4, a target AEI CD of the element 222 is provided.

In operation S6-5, a trim time of the target layer 220 is determined based on the formation time, the ADI CD and the target AEI CD, which are known values. In various embodiments, it assumes that the relationship between the trim time of the target layer 220 and the formation time of the protective layer 130 is a linear relationship, and determining the trim time of the target layer 220 can be conducted by calculating the model (1): (the target AEI CD)−(the ADI CD)=a(the trim time+c×the formation time)+b, in which a is a function of the formation time, and b is a control offset value derived from a feedback function, and c is a function of the formation time and the trim time. That is, "a" is the trim rate of the trimming process. However, the relationship between the trim time of the target layer 220 and the formation time of the protective layer 130 may be a non-linear relationship, and thus applicable models may be different from the model (1). Therefore, in practical applications, models for determining the trim time of the target layer 220 may be altered to fit various relationships between process parameters.

In various embodiments, in order to determine "c" of the model (1), the method further includes: developing a first correlation between formation time and AEI CD under a condition of a constant trim time; developing a second correlation between trim time and AEI CD under a condition of a constant formation time; and determining "c" based on the first correlation and the second correlation before determining the trim time of the target layer 220. For example, "c" of the model (1) can be determined by the correlations shown in FIGS. 4 and 5, and the calculation may be referred to those exemplified for FIGS. 4 and 5, and thus omitted herein.

In operation S6-6, the trimming process is performed on the target layer 220 for the predetermined trim time by using the photoresist pattern PR as a mask to form the element 222. An actual AEI CD of the element 222 may be measured and then fed back to the step of determining the trim time of the target layer 220 (i.e., operation S6-5) to determine b.

It is to be realized that the methods of the embodiments exemplified above, which employ the "formation time" as a control parameter, may be applied in various etching processes to form various structures, such poly gates, metal lines and vias, but not limited thereto.

A method for etching a target layer of a semiconductor device in an etching apparatus is provided. To form an element, the method includes forming a photoresist pattern on the target layer of the semiconductor device, in which the photoresist pattern has an ADI CD. A target AEI CD of the element is provided, as well as a trim time of the target layer. The etching apparatus is provided and a formation time of a protective layer on an inner wall of the etching apparatus is determined based on the ADI CD, the target AEI CD and the trim time. Further, the protective layer for the predetermined formation time is formed to perform a trimming process on the target layer for the trim time by using the photoresist pattern as a mask, so as to form the element.

Another method for etching a target layer of a semiconductor device in an etching apparatus is provided. To form an element, the method includes providing the etching apparatus. A protective layer is formed on an inner wall of the etching apparatus for a formation time. A photoresist pattern is formed on the target layer, in which the photoresist pattern has an ADI CD. A target AEI CD of the element is provided. A trim time of the target layer is determined based on the formation time, the ADI CD and the target AEI CD. A trimming process is performed on the target layer for the predetermined trim time by using the photoresist pattern as a mask to form the element.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for etching a target layer of a semiconductor device in an etching apparatus to form an element, the method comprising:
   forming a photoresist pattern on the target layer of the semiconductor device, wherein the photoresist pattern has an after-develop-inspection critical dimension (ADI CD);
   providing a target after-etch-inspection critical dimension (AEI CD) of the element;
   providing a trim time of the target layer;
   providing the etching apparatus;
   determining a formation time of a protective layer on an inner wall of the etching apparatus based on the ADI CD, the target AEI CD and the trim time;
   forming the protective layer for the predetermined formation time; and
   performing a trimming process on the target layer for the trim time by using the photoresist pattern as a mask to form the element.

2. The method of claim 1, wherein determining the formation time of the protective layer on the inner wall of the etching apparatus is to determine a trim rate of the trimming process.

3. The method of claim 1, wherein determining the formation time of the protective layer on the inner wall of the etching apparatus is conducted by calculating the model: (the target AEI CD)−(the ADI CD)=a(the trim time+c×the formation time)+b, wherein a is a function of the formation time, and b is a control offset value, and c is a function of the formation time and the trim time.

4. The method of claim 3, wherein a is a trim rate of the trimming process.

5. The method of claim 3, wherein c is a negative value.

6. The method of claim 3, further comprising:
developing a first correlation between formation time and AEI CD under a condition of a constant trim time;
developing a second correlation between trim time and AEI CD under a condition of a constant formation time; and
determining c based on the first correlation and the second correlation is before determining the formation time of the protective layer on the inner wall of the etching apparatus.

7. The method of claim 6, wherein determining c based on the first correlation and the second correlation is conducted by calculating a ratio of a slope of a linear regression line of the first correlation to a slope of a linear regression line of the second correlation.

8. The method of claim 1, wherein forming the protective layer on the inner wall of the etching apparatus is conducted by a chemical vapor deposition method.

9. The method of claim 8, wherein the chemical vapor deposition method is conducted by providing silicon gas and oxygen into the etching apparatus.

10. The method of claim 9, wherein the silicon gas is selected from the group consisting of $SiH_2Cl_2$, $SiHCl_3$, $SiCl_4$, $SiF_4$ and a combination thereof.

11. A method for etching a target layer of a semiconductor device in an etching apparatus to form an element, the method comprising:
providing the etching apparatus;
forming a protective layer on an inner wall of the etching apparatus for a formation time;
forming a photoresist pattern on the target layer, wherein the photoresist pattern has an after-develop-inspection critical dimension (ADI CD);
providing a target after-etch-inspection critical dimension (AEI CD) of the element;
determining a trim time of the target layer based on the formation time, the ADI CD and the target AEI CD; and
performing a trimming process on the target layer for the predetermined trim time by using the photoresist pattern as a mask to form the element.

12. The method of claim 11, wherein forming the protective layer on the inner wall of the etching apparatus for the formation time is to determine a trim rate of the trimming process.

13. The method of claim 11, wherein determining the trim time of the target layer is conducted by calculating the model: (the target AEI CD)−(the ADI CD)=a(the trim time+c×the formation time)+b, wherein a is a function of the formation time, and b is a control offset value, and c is a function of the formation time and the trim time.

14. The method of claim 13, wherein a is a trim rate of the trimming process.

15. The method of claim 13, wherein c is a negative value.

16. The method of claim 13, further comprising:
developing a first correlation between formation time and AEI CD under a condition of a constant trim time;
developing a second correlation between trim time and AEI CD under a condition of a constant formation time; and
determining c based on the first correlation and the second correlation before determining the trim time of the target layer.

17. The method of claim 16, wherein determining c based on the first correlation and the second correlation is conducted by calculating a ratio of a slope of a linear regression line of the first correlation to a slope of a linear regression line of the second correlation.

18. The method of claim 11, wherein forming the protective layer on the inner wall of the etching apparatus for the formation time is conducted by a chemical vapor deposition method.

19. The method of claim 18, wherein the chemical vapor deposition method is conducted by providing silicon gas and oxygen into the etching apparatus.

20. The method of claim 19, wherein the silicon gas is selected from the group consisting of $SiH_2Cl_2$, $SiHCl_3$, $SiCl_4$, $SiF_4$ and a combination thereof.

* * * * *